United States Patent [19]
Ng et al.

[11] Patent Number: 5,187,147
[45] Date of Patent: Feb. 16, 1993

[54] METHOD FOR PRODUCING FREESTANDING HIGH TC SUPERCONDUCTING THIN FILMS

[75] Inventors: Hon-Kie Ng; Snezana Kilibarda-Dalafave, both of Tallahassee, Fla.

[73] Assignee: Florida State University, Tallahassee, Fla.

[21] Appl. No.: 708,186

[22] Filed: Sep. 31, 1991

[51] Int. Cl.$^5$ .............................................. B05D 5/12
[52] U.S. Cl. ........................................ 505/1; 505/732; 505/730; 427/62; 427/227; 427/585; 427/255.1; 427/596
[58] Field of Search ................... 505/1, 732, 731, 730; 427/62, 63, 227, 53.1

[56] References Cited

U.S. PATENT DOCUMENTS 4,897,378  1/1990  Chiang .................................... 505/1

FOREIGN PATENT DOCUMENTS 57-188408  11/1982  Japan .
58-185496  10/1983  Japan .

OTHER PUBLICATIONS

Ginley et al., Freestanding Thick Films of YBa(2)Cu(3)O(6.9) by Screenprinting Techniques, J. Mater. Res., vol. 4, No. 3, p. 501 (May/Jun. 1989).

Maxman, Target Preparation Techniques, Nucl. Instr. and Meth 50, pp. 53-60 (1967).

Burton et al., Laser Ablation of YBa(2)Cu(3)O(7-d) Thin Films, Am. Vacum Soc. Series 3, 166 (1987).

H. S. Kwok et al., Laser Evaporation Deposition of Superconducting and Dielectric Thin Films, Appl. Phys. Lett. 52, 1825 (23 May 1988).

Lynds et al., High Tc Superconducting Thin Films Prepared by Pulsed Nd: YAG Laser Ablation, Am. Vacuum Soc. Series 3, 159 (1987).

Moorjani et al., Superconductivity in Bulk and Thin Films of La(1.85)Sr(0.15)CuO(4-d) and Ba(2)YCu(3)O(7-d), Phys. Rev. B 36, 4036 (1 Sep. 1987).

Ng and Kilibarda, Preparation of Unsupported Thin Films of YBa(2)Cu(3)O(x) Compound, Bull. Am. Phys. Soc. 35, No. 6, 1361 (Jun. 1990) (Abstract K99 2).

Kilibarada and Ng, Superconducting Free-standing Thin Films of YBa(2)Cu(3)O(x), Appl. Phys. Lett. 57 (2), 201 (9 Jul. 1990).

Kilibarda and Ng, Laser Deposition of Free-standing Thin Films of YBa(2)Cu(3)O(x), TMS Proceedings in High Temperature Superconducting Compounds, (Feb. 17-21, 1991).

*Primary Examiner*—Shrive Beck
*Assistant Examiner*—Roy V. King
*Attorney, Agent, or Firm*—Senniger, Powers, Leavitt & Roedel

[57] ABSTRACT

A process for producing a freestanding high Tc superconducting thin film is disclosed, which comprises providing a carbon substrate, depositing a high Tc superconducting thin film on the substrate and removing the carbon substrate by converting the carbon substrate to a gaseous composition at a temperature insufficient to cause thermal damage to said superconducting thin film but greater then 500° C. in an oxygen containing atmosphere.

19 Claims, 1 Drawing Sheet

METHOD FOR PRODUCING FREESTANDING HIGH TC SUPERCONDUCTING THIN FILMS

BACKGROUND OF THE INVENTION

The invention generally relates to a method for manufacturing freestanding films of material having a thickness less than one-half micron and even as thin as one-tenth micron. The method has been found to have particular utility in the preparation of films of superconducting $YBa_2Cu_3O_x$, a material which has received considerable attention due to its promising electrical and mechanical properties. This method also has utility in processing a variety of metals, ceramics, oxides or other materials which can be deposited as films.

Superconducting films are used in a variety of electronic and microwave devices. One application of particular interest involves highly sensitive resistance thermometers, that is, bolometers, for use in the study of infrared spectra. Freestanding films of superconducting material are much more desirable for use as bolometer elements than are superconducting films which are integral with substrates. With bolometers, the receipt of infrared radiation by the superconducting element causes a change in the overall resistance of the element. Temperature changes and their value can be detected by passing a constant current across the element and monitoring changes in voltage.

Composites of superconducting films deposited onto substrates are currently available as bolometers. The heat capacity of the substrate material contributes to the overall heat capacity of the bolometer. The heat capacity of substrate material typically may be, for example, on the order of forty times the heat capacity of the superconducting material. A significant amount of radiation is therefore absorbed by the substrate rather than by the superconducting film. The sensitivity of the bolometer is sacrificed because a significant quantity of heat variation is absorbed by the substrate, not by the film, and thus these changes in radiation are not translated into detectable changes in voltage across the superconducting element. This adverse heat-absorptive contribution of the supporting substrate can be eliminated through the use of films of superconducting material which are freestanding, that is, not integral with supporting substrates. The lower thermal mass of a freestanding film, as opposed to a substrate/thin film composite, has been found to result in an approximately tenfold increase in bolometer sensitivity. Freestanding material processed according to this invention therefore allows for the detection of much smaller fluctuations in infrared radiation.

In addition to being freestanding, superconducting films used as bolometers are desirably as thin as practically possible. For example, a bolometer which is 50 microns thick will have a heat capacity, or thermal mass, 100 times greater than a bolometer of the same area which is only one-half micron thick. As discussed above, a lower thermal mass corresponds to greater bolometer sensitivity.

Another application of particular utility for thin freestanding films of a particular material is the measurement of the optical properties of the material. Reflectance, rather than transmission, is commonly measured for thin films deposited onto substrates which are opaque in the spectral region of interest. The availability of material as thin freestanding films rather than only as films on substrates facilitates the measurement of transmission. One instance where transmission measurements are of particular interest involves the determination of the energy gap of superconducting materials. The energy gap is the range of electromagnetic energy in which the material has zero absorption, when applied to material in the superconducting state. Although present technical limitations do not permit determination of the energy gap directly with much precision, it can be determined indirectly by optical measurements as set forth in Mattis and Bardeen, *Theory of Anomalous Skin Effect in Normal and Superconducting Metals*, Phys. Rev. 111 (Jul. 15, 1958). Transmission measurements, as contrasted with reflectance measurements, generally give a more precise value of energy gap using the Mattis-Bardeen theory.

Thin freestanding films of ceramic, metal or oxide are similarly advantageous to other technologies where the substrate is an annoyance or an obstacle or otherwise interferes with optimal operation or utility.

Thin films have been deposited onto substrates by various methods including laser ablation, sputtering, backscattering, electron beam deposition, molecular beam epitaxy, spray pyrolysis and the like. Superconducting material such as $YBa_2Cu_3O_x$ has been deposited to form thin films on various substrates including $SrTiO_3$, $KTiO_3$, MgO and $ZrO_2$.

A variety of methods have been used to prepare freestanding thin films from the substrate/thin film composites resulting from the deposition methods described above. One method available heretofore for removing the substrate from the film is to preferentially dissolve the substrate into an appropriate solvent as described generally in S. H. Maxman, *Target Preparation Techniques*, Nuclear Instr. and Meth. 50, p.56 (1967). This deposition/dissolution process is inappropriate for the manufacture of films of certain materials due to the potential incompatibility of the solvent and the material. Contamination of the film material by the solvent and its by-products can also be a problem. For example, when producing films of $YBa_2Cu_3O_x$, the presence of water in the solvent undesirably results in the formation of $Ba(OH)_2$ in the film and, upon further reaction, $BaCO_3$.

Another method heretofore available for separating a film from its substrate and thus obtaining freestanding films is disclosed in D. S. Ginley et al., *Freestanding Thick Films of $YBa_2Cu_3O_{6.9}$ by Screenprinting Techniques*, J. Mater. Res., vol. 4, No. 3 (1989). According to this method, sintered compacts of $YBa_2Cu_3O_{6.9}$ were milled into powder form. Dry ground $YBa_2Cu_3O_{6.9}$ powder and powder/alcohol mixtures were directly screenprinted onto silica substrates. The composite comprising the screenprinted film and substrate was sintered to effectuate resintering of the $YBa_2Cu_3O_{6.9}$. Freestanding material was obtained because, upon cooling, an interfacial reaction between the substrate and the sintered film resulted in debonding of the film from the substrate. The minimum thickness of films obtainable by this method is limited by the mechanical strength of the material and by the existence of a substantial reaction zone within the ceramic material. This reaction zone creates a mechanically weak interface vulnerable to shearing caused by mismatch in thermal expansion between the substrate and the ceramic material. The results obtained with sheets on the order of 20 microns thick were erratic. Sheets of less than 50 microns did not have the mechanical strength to debond from large areas of substrates. Additionally, the elemental distribution within the final product was determined to be nonhomogeneous.

Freestanding thin films have also been produced by stripping a thin mass of material from a bulk mass with adhesive tape or by physically cleaving a thin layer from a bulk sample. Disadvantageously, however, the thickness, uniformity and surface area of films produced by such techniques are difficult to control. The reliability and repeatability of these methods are therefore highly sensitive to the degree of skill and attention exercised by the operator.

There is, therefore, a need for a reliable and repeatable method of producing freestanding thin films on the order of less than a half micron in thickness of ceramics, oxides, metals and other materials which may be deposited as thin films.

SUMMARY OF THE INVENTION

It is an object of this invention to provide a reliable and repeatable method for the production of freestanding thin films of ceramic, oxide, metal or other material which may be deposited as a thin film onto a substrate.

It is a further object of this invention to provide such a method which is adaptable for the production of films of substantially uncontaminated superconducting material.

It is a further object of this invention to provide such a method wherein the thin film does not come into contact with potentially contaminating solvents.

It is a further object of this invention to provide such a method wherein the quality and repeatability of the results obtained are substantially independent of the skill and attention of a human operator.

It is a further object of this invention to provide such a method which is capable of producing films of uniform thickness on the order of less than about one-half micron and as thin as about one-tenth micron.

It is a further object of this invention to provide a method for the production of freestanding thin films of superconducting material suitable for incorporation into electronic, microwave and similar devices.

It is a further object of this invention to provide a method for the production of freestanding thin films characterized by homogeneous elemental distribution.

It is a further object of this invention to provide a method for the production of freestanding thin films which heretofore have only been available as films integral with substrates.

It is a further object of this invention to provide a method for the production of freestanding thin films which are particularly suited for measuring the optical properties of the material.

It is a further object of this invention to provide a method for the production of freestanding thin films which are particularly suited for use as bolometers.

Briefly, therefore, the present invention relates to a process for producing a freestanding thin film of a first material selected from metals, oxides and ceramics capable of being deposited as a thin film onto a substrate. A substrate of a second material is provided which is capable of being converted to a gaseous composition under predetermined conditions. The first material is deposited onto the substrate as a thin film to form a composite of the substrate and the thin film of the first material. The composite is subjected to the predetermined conditions to convert the substrate to a gaseous composition, the predetermined conditions being sufficiently mild relative to the first material to avoid a degradation of the thin film of the first material.

The invention is also directed to a thin flat piece of $YBa_2Cu_3O_x$ having a substantially uniform thickness between about 0.08 micron and about 2.0 microns and a surface area greater than 16 $mm^2$.

DETAILED DESCRIPTION OF THE PREFERRED EMBODIMENTS

In accordance with the process of the present invention, a first material, superconducting $YBa_2Cu_3O_x$, where x is between about 6.5 and 7.0 inclusive, preferably approaching 7.0, can be prepared as a thin, freestanding film, that is, a film unsupported by a substrate. Superconducting $YBa_2Cu_3O_x$ is provided in bulk form and can be processed by this method as described hereinbelow into a film which is thinner than about one-half micron and even as thin as about one-tenth micron. Other metal, oxide or ceramic materials, whether or not superconducting, can also be prepared by this process, so long as they are the type of materials which can be deposited as a thin film onto a substrate by available thin film technology.

A substrate of a second material is provided to receive a thin film of the first material by deposition. In the preferred embodiment of this invention, where the freestanding film to be prepared is superconducting $YBa_2Cu_3O_x$, carbon is the preferred second material selected for the substrate. The first material is deposited onto the second material to form a composite by an appropriate deposition technique as described in further detail hereinbelow. The substrate is removed from the thin film/substrate composite by heating the composite to a temperature at which the substrate is volatilized. Thus, this second material must have a volatilization temperature which is less than the temperature at which the film of the first material suffers thermal damage. Carbon is the preferred second material selected for the substrate because it can be volatilized by oxidation at about 530° C., a temperature which is insufficient to thermally damage $YBa_2Cu_3O_x$.

In the preferred embodiment of this invention, the carbon substrate is prepared by the method as generally described in S. H. Maxman, *Target Preparation Techniques*, Nuclear Instr. and Meth. 50, p.56 (1967). More specifically, a release agent is spread onto a glass microscope slide. A thin carbon coating is sputtered onto the slide, and the release agent is preferentially dissolved by immersion of the slide, with the release agent and carbon film thereon, in a suitable solvent. As the release agent dissolves, the thin carbon film separates from the slide and floats on top of the solvent.

Figure 2:
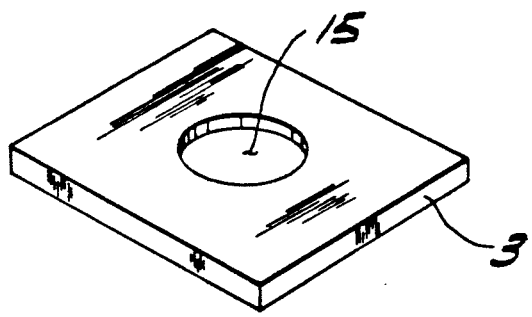
FIG. 2 is a perspective of a holder used in carrying out of the method of the invention.
Figure 6:
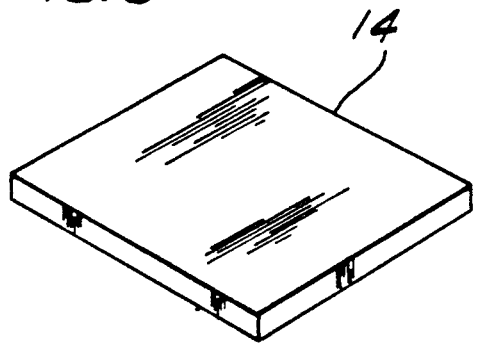
FIG. 6 is a perspective of holder used in carrying out the method of the invention as an optional replacement for the holder of FIG. 2.

Referring now to FIG. 2, a holder 3 is provided to support this thin carbon film during subsequent processing. Holder 3 is preferably constructed of Y(Pr)Ba$_2$Cu$_3$O$_x$. In another preferred embodiment, shown in FIG. 6, holder 14 is constructed of MgO, SrTiO$_3$, Al$_2$O$_3$ or other oxide or ceramic material. The size of holder 3 is on the order of 10 mm×10 mm×1 mm. The smallest dimension, the thickness, of the holder is not of particular importance to this invention, but it will generally be less than about 5 mm. The area of the holder, however, directly corresponds to the area of the thin freestanding film ultimately produced by this process. The surface area of the final product can therefore be controlled by selecting a holder having the same area as the area desired for the thin freestanding film to be produced. The surface area may be between about 4 mm$^2$ and about 300 mm$^2$. Holder 3 may optionally have a central hole 15 through the thickness the holder as shown in FIG. 2, or may have a solid construction as depicted by holder 14 shown in FIG. 6. The function of this optional central hole is described hereinbelow.

Figure 3:
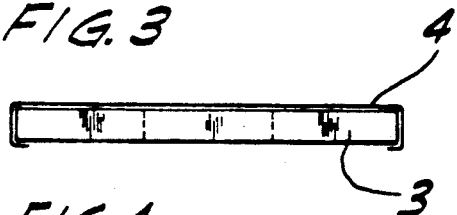
FIG. 3 is a side view of the holder of FIG. 2 illustrating the placement of substrate material thereon.

The thin carbon film substrate is removed from the solvent and, as shown in FIG. 3, substrate 4 is placed onto and wrapped around the edges of holder 3. Carbon film substrate 4 is wrapped around holder 3 in this manner to secure substrate 4 in this position during subsequent movement, placement and heating of holder 3 as described hereinbelow. Specifically, it has been discovered that wrapping substrate 4 around holder 3 in this manner prevents substrate 4 from curling upon the application of heat during subsequent processing.

Substrate 4, as positioned on holder 3, is now prepared to receive the first material by deposition in accordance with the method of this invention. The deposition of the first material onto the substrate to form a composite may be achieved by any of a variety of available thin film techniques such as laser ablation, sputtering, backscattering, molecular beam epitaxy, electron beam deposition, thermal evaporation, spray pyrolysis or other known or hereafter developed thin film deposition techniques. In the preferred embodiment of the invention where a first material of YBa$_2$Cu$_3$O$_x$ is deposited onto a carbon substrate, laser ablation and sputtering are the preferred deposition techniques, either directly or by backscattering. Moorjani et al., *Superconductivity in Bulk and Thin Films of La(1.85)Sr(0.15-)CuO(4-d) and Ba(2)YCu(3)O(7-d)*, Phys. Rev. B 36, 4036 (Sep. 1, 1987), describe generally the laser ablation process.

Figure 1:
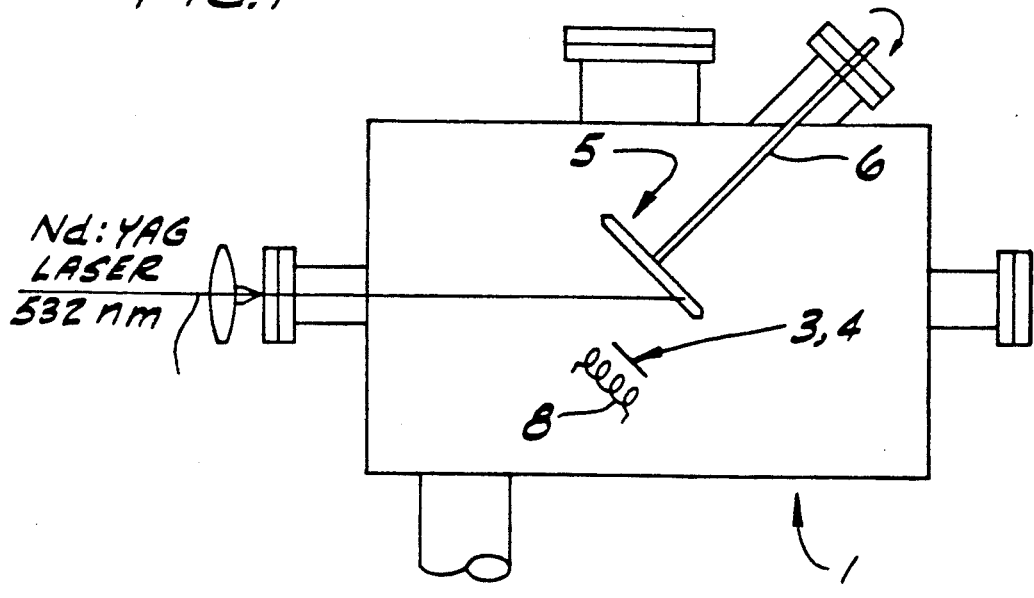
FIG. 1 is a schematic of a prior art laser ablation apparatus.

Referring now to FIG. 1., a schematic of a prior art laser ablation chamber appropriate for use in connection with this invention, the combination of substrate 4 maintained by holder 3 is placed in laser ablation chamber 1. A sintered disk of superconducting source (target) material 5 is placed at the end of rotating shaft 6 about 1.5 cm away from substrate 4. Ablation chamber 1 is evacuated to a low mTorr range by turbomolecular pump 7 in communication with chamber 1. Carbon substrate 4 is heated by resistance heater 8 to an elevated temperature as required for deposition of ablated material thereon. Pulsed Nd:YAG (Neodymium: yttrium aluminum garnet) laser 9 impinges source material 5, ablating material from source 5 which is deposited as a film onto substrate 4.

Sputtering, as opposed to laser ablation, can also be used for carrying out the deposition step of this invention. Sputtering involves the ejection of material from the target due to heavy-ion impact and deposition of the ejected material onto a substrate. Backscattering is a variation of laser ablation or sputtering wherein a barrier is placed between the substrate and the target material, thereby preventing material from traveling in a straight line from the target to the substrate. However, a percentage of material removed from the source is carried by the atmosphere in the deposition chamber around the barrier and into depositing contact with the substrate. A particular method of deposition, besides laser ablation or sputtering, however, may be selected for various reasons, including equipment availability, the method's appropriateness for depositing the selected material, or the like.

Figure 4:
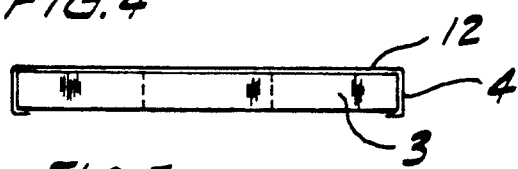
FIG. 4 is a side view of the holder of FIGS. 2 and 3 illustrating a thin film of first material deposited thereon.
Figure 5:
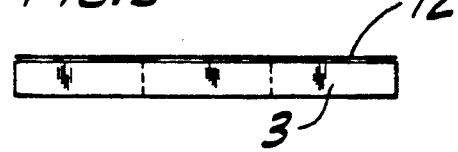
FIG. 5 is a side view of the holder of FIGS. 2-4 after removal of the substrate material therefrom.

FIG. 4 illustrates the composite of substrate 4 and thin film 12 supported by holder 3 which is produced by the above-described deposition process. A thin, freestanding film is prepared from this composite by heating the composite to a temperature which is high enough to volatilize the substrate 4, but not so high that thin film 12 suffers thermal damage. This volatilization operation is preferably, though not necessarily, carried out in the same apparatus as the deposition operation where, for example, the deposition was carried out in a laser ablation chamber. In the preferred embodiment of this invention, where the composite comprises a first thin film material of superconducting YBa$_2$Cu$_3$O$_x$ and the second material forming the substrate is carbon, the composite is heated to above about 530° C. by resistance heater 8 in an oxygen containing atmosphere to volatilize carbon substrate 4 by oxidation. The central hole 15 in the holder 3 may be provided to facilitate the escape of volatilized substrate material such that it does not have to travel through the thin film deposited thereon. Central hole 15 also permits observation of both sides of the thin film, and the shining of light therethrough, without removing it from the holder. Referring now to FIG. 5, after removal of the carbon substrate by volatilization, a freestanding film 12 thinner than one-half micron of the superconducting YBa$_2$Cu$_3$O$_x$ first material remains positioned on holder 3.

An important aspect of the process of the present invention, therefore, is the relation between the thermal properties of the first material and those of the second material selected for the substrate. The first material which is processed into the thin, freestanding film, whether it be a selected ceramic, oxide, metal or other material, must be capable of surviving the temperature necessary to volatilize the second material of the underlying substrate. A freestanding film of a particular material, therefore, may be prepared by this method so long as elevated temperature used to volatilize the substrate does not damage the thin film material to such an extent it lacks utility for its intended purpose. In other words, the predetermined conditions, including temperature, pressure and oxygen content, which are necessary to convert the substrate to a gaseous composition, must be sufficiently mild relative to the first material to avoid a degradation of the thin film of the first material.

After volatilization of the substrate, the thin film 12 may be cooled, or an optional annealing operation can be performed. In the preferred embodiment of the invention, the YBa$_2$Cu$_3$O$_x$ freestanding film is heated to about 720° C. in an oxygen containing atmosphere and held at that temperature for about 5 minutes. This annealing operation may be carried out in the same apparatus, preferably laser ablation chamber 1 of FIG. 1, as the prior deposition and volatilization operations. This preferred annealing operation is performed immediately after volatilization of the carbon substrate, with no intervening cooling operation. The annealing operation ensures that the oxygen content of the $YBa_2Cu_3O_x$ approaches the stoichiometric value and that the crystal structure is substantially entirely superconducting 1-2-3 orthorhombic phase.

Films as small as about 4 mm×4 mm and as large as about 15 mm×15 mm have been manufactured by this process. The process of this invention is capable of producing thin, flat pieces of $YBa_2Cu_3O_x$ which are thinner than one-half micron and even as thin as or thinner than about one-tenth micron. However, films as thick as about 2.0 microns have been made by this method. The thickness of the freestanding film produced by this method corresponds to the thickness of the film initially deposited onto the substrate and thus can be controlled by selection of parameters such as deposition time and the like in accordance with the selected deposition method. The minimum thickness which can be achieved is primarily a function of the inherent strength of the material. Stronger materials may be processed into thinner sheets while still avoiding disintegration. Additionally, limitations inherent with the selected method of deposition determine the range of film thickness producible by this method, i.e. some deposition methods may be capable of depositing thinner films than others.

EXAMPLE 1

An unsupported carbon film with a thickness of approximately 1500 angstroms was prepared by the method as described generally in S. H. Maxman, *Target Preparation Techniques*, Nuclear Instr. and Meth. 50, p.56 (1967). A hydrocarbon release agent sold by Shell Chemical Company of Houston, Tex. under the trade designation neodol was spread in a thin layer over a microscope glass slide. A carbon film about 1500 angstroms thick was then sputtered onto the glass slide. The coated slide was dipped into deionized water which dissolved the neodol beneath the carbon layer, leaving a thin film of carbon floating on the deionized water. A holder of about 10 mm×10 mm×1 mm and constructed of $Y(Pr)Ba_2Cu_3O_x$ was provided. The carbon film was placed on the holder and wrapped around the edges of the holder to help maintain it on the holder.

A $YBa_2Cu_3O_x$ film was deposited onto the dried carbon substrate by a laser ablation technique similar to that described in H. S. Kwok et al., *Laser Evaporation Deposition of Superconducting and Dielectric Thin Films*, Appl. Phys. Lett. 52, 1825 (May 23, 1988) and Moorjani et al., *Superconductivity in Bulk and Thin Films of $La(1.85)Sr(0.15)CuO(4-d)$ and $Ba(2)YCu(3)O(7-d)$*, Phys. Rev. B 36, 4036 (Sep. 1, 1987). More particularly, the $Y(Pr)Ba_2Cu_3O_x$ holder with carbon film thereon was mounted at an angle of 45° from horizontal within a laser ablation chamber. A target composed of $YBa_2Cu_3O_x$ was placed about 1.5 cm away from the carbon film and at the end of a rotating shaft. The ablation chamber was evacuated to a low mTorr range by a turbomolecular pump in communication with the chamber. The carbon film substrate was heated to approximately 500° C. by a resistance heater within the chamber. A pulsed Nd:YAG laser beam tuned to the 532 nm line at a power input of 55 mJ/pulse was focused to impact a spot on the target of less than 1 mm². The target material was ablated and deposited onto the carbon film substrate for about 180 minutes. After the ablation process, there was a thin film on top of the carbon substrate supported by the holder.

Upon completion of the laser ablation process, the chamber was backfilled with oxygen to a pressure of about 1 Torr and the substrate was heated by the resistance heater to above 530° C. to volatilize the carbon film substrate by oxidation. Under these conditions, it took about one minute to completely volatilize the carbon substrate. The holder was equipped with a central hole to allow the oxidized carbon to escape without passing through the thin film of the yttrium compound. Upon completing the oxidative removal of the substrate, there remained on the holder a freestanding thin film of $YBa_2Cu_3O_x$ less than one-half micron thick. The temperature was further increased to about 720° C. for about 5 minutes to anneal the thin film in an oxygen atmosphere and thus achieve stoichiometric oxygen content. The film was annealed at this elevated temperature to ensure that its crystal structure was substantially entirely superconducting 1-2-3 orthorhombic phase, as determined using a Siemen D500 X-ray diffractometer. The film was controlledly cooled to room temperature at a rate of about 4° C. per minute. The deposition, volatilization and annealing operations were all performed in the same laser ablation chamber.

Chemical analysis by Energy Dispersion X-ray Flourescence revealed yttrium, barium, copper and oxygen in stoichiometric ratio and no detectable level of carbon contamination. $Y(Pr)Ba_2Cu_3O_x$ was chosen for holder material because its thermal behavior corresponds to that of the $YBa_2Cu_3O_x$ being deposited. The Pr in the compound renders the holder non-superconducting. Therefore resistivity measurements could be performed on the finished product without removing it from the holder, as there would be no superconducting contribution from the holder. The onset temperature of superconductance for the film was determined to be 85K. The hole through the thickness of the holder allowed for the viewing of both sides of the thin film without removing it from the holder. Photomicrographs revealed the film to have a uniform thickness of about one third of a micron.

EXAMPLE 2

The process was carried out in the same manner as in EXAMPLE 1, except that holders constructed of $SrTiO_3$, $Al_2O_3$ or MgO were used. The holders did not have a central hole as did the holder used in connection with EXAMPLE 1. A thin carbon film was placed on the holder and wrapped around its edges as in EXAMPLE 1. Superconductive material was then deposited onto the carbon film by laser ablation as described in connection with EXAMPLE 1. Subsequent volatilization of the carbon film resulted in a freestanding thin superconducting film which was completely detached from the oxide holder. The films produced by the method of EXAMPLE 2 appeared smoother than those produced by the method of EXAMPLE 1, where a $Y(Pr)Ba_2Cu_3O_x$ holder with a central hole was used.

EXAMPLE 3

The process was carried out in the same manner as set forth in EXAMPLE 1, except that the laser ablation technique was modified by placing a barrier between the target and the substrate prior to laser ablation. According to this technique, backscattering, ablated material does not directly impinge the substrate. Only that ablated material which is suspended in the chamber atmosphere and travels around the barrier is deposited onto the substrate.

Though the required deposition time for a given thickness of material is approximately tripled, films produced by backscattering have been found to be smoother than those produced by normal laser ablation.

In view of the above, it will be seen that the several objects of the invention are achieved and other advantageous results obtained.

As various changes could be made in the above embodiments without departing from the scope of the invention, it is intended that all matter contained in the above description or shown in the accompanying drawings shall be interpreted as illustrative and not in a limiting sense.

What is claimed is:

1. A process for producing a freestanding thin film of high Tc superconducting material, the process comprising:
    providing a carbon substrate,
    depositing the high Tc superconducting materials onto the substrate as a thin film to form a composite of the substrate and the thin film of the high Tc superconducting materials, and
    removing the substrate from the composite by converting the substrate to a gaseous composition at a temperature insufficient to cause thermal damage to said thin film of high Tc superconducting material but greater than 500° C. in an oxygen containing atmosphere.

2. A process as set forth in claim 1 comprising the additional step of annealing said thin film by heating said thin film to a temperature above about 700° C. and holding it at that temperature for at least about 4 minutes.

3. A process as set forth in claim 2 comprising the additional step of cooling said thin film at a rate of about 4° C. per minute.

4. A process as set forth in claim 1 wherein the high Tc superconducting material is deposited by laser ablation.

5. A process as set forth in claim 1 wherein said depositing and said removing steps are accomplished within a single common chamber.

6. A process as set forth in claim 1 comprising the additional step of providing a holder and placing said substrate onto said holder prior to said depositing step.

7. A process as set forth in claim 1 wherein the thickness of said thin film of high Tc superconducting material is between about 0.08 micron and about 2.0 microns.

8. A process as set forth in claim 6 wherein said holder is constructed of material selected from the group of materials comprising $Al_2O_3$, $MgO$ and $SrTiO_3$.

9. A process as set forth in claim 6 wherein said holder is between about 0.5 and about 5 mm thick and has two opposed sides, each having an area between about 4 $mm^2$ and about 300 $mm^2$.

10. A process for producing a freestanding thin film of $YBa_2Cu_3O_x$, the process comprising:
    providing a carbon substrate,
    depositing the $YBa_2Cu_3O_x$ onto the carbon substrate as a thin film to form a composite of the carbon substrate and the thin film of the $YBa_2Cu_3O_x$, and removing the carbon substrate from the composite by exposing the composite to an oxygen containing atmosphere and a temperature insufficient to cause thermal damage to the thin film of $YBa_2Cu_3O_x$ but greater than 500° C. whereby the carbon is converted to a gaseous composition.

11. A process as set forth in claim 10 comprising the additional step of annealing said thin film by heating said thin film to a temperature above about 700° C. and holding it at that temperature for at least about 4 minutes.

12. A process as set forth in claim 11 comprising the additional step of controlledly cooling said thin film at a rate of about 4° C. per minute.

13. A process as set forth in claim 10 wherein said depositing is accomplished by a method selected from the group of methods comprising laser ablation, sputtering, backscattering, molecular beam epitaxy, electron beam deposition, thermal evaporation and spray pyrolysis.

14. A process as set forth in claim 10 wherein said depositing is accomplished by laser ablation of said $YBa_2Cu_3O_x$ from a bulk source of $YBa_2Cu_3O_x$ and deposition of ablated $YBa_2Cu_3O_x$ onto said substrate.

15. A process as set forth in claim 10 wherein said depositing and said removing steps are accomplished within the same chamber.

16. A process as set forth in claim 10 comprising the additional step of providing a holder and placing said substrate onto said holder prior to said depositing step.

17. A process as set forth in claim 16 wherein said holder is constructed of $Y(Pr)Ba_2Cu_3O_x$.

18. A process as set forth in claim 16 wherein said holder is constructed of material selected from the group of materials comprising $Al_2O_3$, $MgO$ and $SrTiO_3$.

19. A process as set forth in claim 16 wherein said holder is between about 0.5 and about 5 mm thick and has two opposed sides, each having an area between about 4 $mm^2$ and about 300 $mm^2$.

* * * * *

UNITED STATES PATENT AND TRADEMARK OFFICE
CERTIFICATE OF CORRECTION

PATENT NO. : 5,187,147

DATED : February 16, 1993

INVENTOR(S) : Hon-Kie Ng et.al.

It is certified that error appears in the above-identified patent and that said Letters Patent is hereby corrected as shown below:

On title page, item [22]
"September 31, 1991", it should read ---May 31, 1991---.

Signed and Sealed this

Twenty-fourth Day of May, 1994

Attest:

BRUCE LEHMAN

*Attesting Officer*    *Commissioner of Patents and Trademarks*